United States Patent
Clore

(10) Patent No.: US 9,478,473 B2
(45) Date of Patent: Oct. 25, 2016

(54) FABRICATING A MICROELECTRONICS LID USING SOL-GEL PROCESSING

(71) Applicant: GLOBALFOUNDRIES INC., Grand Cayman (KY)

(72) Inventor: Nicholas G. Clore, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 84 days.

(21) Appl. No.: 13/898,597

(22) Filed: May 21, 2013

(65) Prior Publication Data

US 2014/0346658 A1 Nov. 27, 2014

(51) Int. Cl.
| | | |
|---|---|---|
| H01L 23/04 | (2006.01) | |
| H01L 23/10 | (2006.01) | |
| H01L 23/36 | (2006.01) | |
| H01L 23/373 | (2006.01) | |
| H01L 23/40 | (2006.01) | |
| H01L 21/50 | (2006.01) | |
| H01L 23/24 | (2006.01) | |

(52) U.S. Cl.
CPC .............. *H01L 23/24* (2013.01); *H01L 21/50* (2013.01); *H01L 23/04* (2013.01); *H01L 23/10* (2013.01); *H01L 23/36* (2013.01); *H01L 23/373* (2013.01); *H01L 23/3735* (2013.01); *H01L 23/40* (2013.01); *H01L 2924/0002* (2013.01)

(58) Field of Classification Search
CPC ....... H01L 23/10; H01L 23/04; H01L 23/24; H01L 23/36; H01L 23/40; H01L 23/373; H01L 23/3735; H01L 23/45; H01L 21/50
USPC .......................................... 257/704, 76, 707
See application file for complete search history.

(56) References Cited

U.S. PATENT DOCUMENTS

| | | | | |
|---|---|---|---|---|
| 4,303,934 A | * | 12/1981 | Stitt ....................... | G11C 16/18 174/538 |
| 4,709,301 A | * | 11/1987 | Yamaguti ................ | H01L 23/04 257/E23.14 |
| 5,106,784 A | * | 4/1992 | Bednarz .................. | H01L 21/50 257/E21.499 |
| 5,270,262 A | * | 12/1993 | Switky .................... | H01L 21/50 257/E21.499 |
| 5,276,414 A | * | 1/1994 | Fujimoto .................. | H01P 1/30 257/788 |
| 5,343,076 A | * | 8/1994 | Katayama ............. | H01L 23/057 257/690 |
| 5,349,240 A | * | 9/1994 | Narita ..................... | H01L 23/24 257/787 |
| 5,416,358 A | * | 5/1995 | Ochi ..................... | G06K 19/077 257/666 |

(Continued)

FOREIGN PATENT DOCUMENTS

JP 2002203989 A 7/2002

OTHER PUBLICATIONS

Narahashi, "Low Df Build-up Material for High Frequency Signal Transmission of Substrates", The 63rd Electronic Components and Technology Conference (ECTC), Las Vegas, Nevada, USA, May 28-31, 2013, pp. 1-26.

(Continued)

*Primary Examiner* — David Zarneke
(74) *Attorney, Agent, or Firm* — Hoffman Warnick LLC

(57) ABSTRACT

A method for fabrication of a lid for a microelectronic device is described, wherein the microelectronic device comprises of a die and a laminate. A gel is formed having a coefficient of thermal expansion (CTE) within a threshold percentage value of either a CTE of the die or a CTE of the laminate of the microelectronics device. A metal piece is inserted into the gel to form a lid.

18 Claims, 2 Drawing Sheets

(56) References Cited

U.S. PATENT DOCUMENTS

| | | | |
|---|---|---|---|
| 5,907,190 A * | 5/1999 | Ishikawa et al. | 257/795 |
| 6,075,289 A * | 6/2000 | Distefano | 257/732 |
| 6,117,705 A * | 9/2000 | Glenn | G11C 16/18 257/E23.181 |
| 6,274,927 B1 * | 8/2001 | Glenn | H01L 23/10 257/680 |
| 6,384,472 B1 * | 5/2002 | Huang | H01L 21/50 257/676 |
| 6,472,762 B1 * | 10/2002 | Kutlu | 257/778 |
| 6,526,653 B1 * | 3/2003 | Glenn | H01L 23/04 174/521 |
| 6,696,752 B2 * | 2/2004 | Su | H01L 21/565 257/666 |
| 6,713,867 B2 * | 3/2004 | Mannak | H01L 23/295 257/678 |
| 6,844,621 B2 * | 1/2005 | Morozumi et al. | 257/700 |
| 6,919,620 B1 * | 7/2005 | Miks | H01L 23/49575 257/666 |
| 7,242,068 B2 * | 7/2007 | Huang | H01L 27/14618 257/433 |
| 7,294,907 B2 * | 11/2007 | Minamio | H01L 27/14618 257/621 |
| 7,408,258 B2 | 8/2008 | Salmon | |
| 7,724,527 B2 | 5/2010 | Coico et al. | |
| 7,803,664 B2 | 9/2010 | Colgan et al. | |
| 7,833,839 B1 * | 11/2010 | Touzelbaev et al. | 438/122 |
| 8,008,673 B2 | 8/2011 | Nagai | |
| 8,208,259 B1 | 6/2012 | Wolfe et al. | |
| 8,421,212 B2 * | 4/2013 | Chen | H01L 23/13 257/693 |
| 8,531,025 B2 * | 9/2013 | Edwards et al. | 257/712 |
| 8,957,316 B2 * | 2/2015 | Fields et al. | 174/252 |
| 9,136,399 B2 * | 9/2015 | Doraisamy | H01L 29/84 |
| 2003/0067069 A1 * | 4/2003 | Lebonheur et al. | 257/706 |
| 2005/0139994 A1 * | 6/2005 | Hsu et al. | 257/706 |
| 2006/0001114 A1 * | 1/2006 | Chen | B81C 1/00301 257/415 |
| 2007/0023873 A1 * | 2/2007 | Park | H01L 23/24 257/666 |
| 2007/0164424 A1 * | 7/2007 | Dean et al. | 257/707 |
| 2007/0284719 A1 * | 12/2007 | Shiota et al. | 257/687 |
| 2008/0006932 A1 * | 1/2008 | Koga et al. | 257/712 |
| 2008/0165519 A1 * | 7/2008 | Nystrom et al. | 361/807 |
| 2009/0057877 A1 * | 3/2009 | Touzelbaev et al. | 257/706 |
| 2009/0168388 A1 * | 7/2009 | Wong et al. | 361/813 |
| 2009/0298235 A1 * | 12/2009 | Kostiew et al. | 438/118 |
| 2010/0157538 A1 * | 6/2010 | Wang et al. | 361/704 |
| 2010/0181665 A1 * | 7/2010 | Casey et al. | 257/723 |
| 2010/0302739 A1 * | 12/2010 | Wang et al. | 361/713 |
| 2011/0036390 A1 | 2/2011 | Nelson et al. | |
| 2012/0067871 A1 * | 3/2012 | Sherrer et al. | 219/678 |
| 2012/0133012 A1 | 5/2012 | Rees et al. | |
| 2012/0155061 A1 | 6/2012 | Manabe et al. | |
| 2012/0319266 A1 * | 12/2012 | Park et al. | 257/706 |
| 2013/0069215 A1 * | 3/2013 | Nakao et al. | 257/687 |
| 2013/0134572 A1 * | 5/2013 | Lenniger et al. | 257/690 |
| 2013/0154124 A1 * | 6/2013 | Hallock et al. | 257/782 |
| 2013/0199529 A1 * | 8/2013 | Power et al. | 128/203.29 |
| 2013/0249100 A1 * | 9/2013 | Morishita et al. | 257/772 |
| 2013/0256920 A1 * | 10/2013 | Sugimura et al. | 257/777 |
| 2013/0320517 A1 * | 12/2013 | Shirley | 257/704 |
| 2014/0035123 A1 * | 2/2014 | Oka | H01L 23/367 257/712 |
| 2014/0319669 A1 * | 10/2014 | Kimijima et al. | 257/687 |

OTHER PUBLICATIONS

"What is Aerogel?", http://www.aerogel.org/?p=3, Accessed on Mar. 18, 2015, 8 pages.

* cited by examiner

FABRICATING A MICROELECTRONICS LID USING SOL-GEL PROCESSING

FIELD OF THE INVENTION

The present invention relates generally to microelectronic fabrication, and more particularly to the fabrication of a lid using sol-gel processing for a microelectronic device.

BACKGROUND

The sol-gel process is a wet-chemical technique that is widely used in the fields of materials science and ceramic engineering. The process is primarily for the fabrication of materials, such as metal oxides, starting from a colloidal solution (sol) that acts as a precursor for an integrated network (or gel) of either discrete particles or network polymers. The "sol" or solution gradually evolves towards the formation of a gel-like diphasic system containing both a liquid phase and solid phase whose morphologies range from discrete particles to continuous polymer networks.

Aerogel is a synthetic, porous, ultralight gel with extremely low density and thermal conductivity, formed via the sol-gel process. Aerogels are produced by extracting the liquid component of a gel through supercritical drying. This allows the liquid to be slowly dried off without causing the solid matrix in the gel to collapse from capillary action, as would happen with conventional evaporation. Silica aerogel is the most common type of aerogel and the most extensively studied and used.

A xerogel is another gel formed via the sol-gel process, however, instead of being dried by supercritical drying, xerogels are dried by evaporation. Xerogels usually retain high porosity and enormous surface area along with very small pore size. The main distinction between aerogel and xerogel rests on their densities. Aerogel is typically 90-99% air while xerogel is typically 60-99% air.

SUMMARY

Embodiments of the invention include a method and apparatus for the fabrication of a microelectronic lid for a microelectronic device, wherein the microelectronic device comprises of a die and a laminate. A gel is formed having a coefficient of thermal expansion (CTE) within a threshold percentage value of either a CTE of the die or a CTE of the laminate of the microelectronics device. A metal piece is inserted into the gel to form a lid.

DETAILED DESCRIPTION

Figure 1:
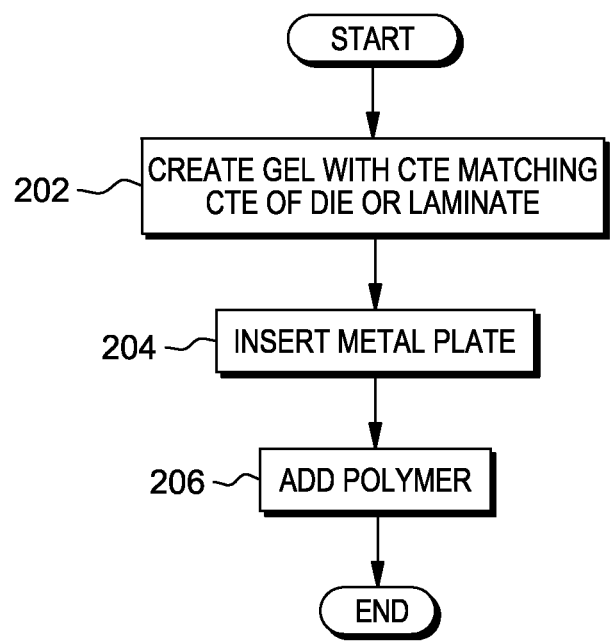
FIG. 1 is a flowchart describing the process of fabricating a lid for a microelectronic device using sol-gel processing, in accordance with an embodiment of the invention.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure, may be present between the first element and the second element. The term "direct contact" means that a first element, such as a first structure, and a second element, such as a second structure, are connected without any intermediary conducting, insulating or semiconductor layers at the interface of the two elements.

FIG. 1 is a flowchart describing the process of fabricating a lid for a microelectronic device using sol-gel processing for the purpose of reducing stress and warpage, in accordance with an embodiment of the invention. In an exemplary embodiment, sol-gel processing is used to create a gel, specifically xerogel or aerogel, with a coefficient of thermal expansion (CTE) matching either the die or laminate of a microelectronics device (step 202). Although aerogel may not have many of the physical properties of a gel, for the purposes of the embodiments of the invention, aerogel is a gel. Sol-gel processing is used to create a gel with a CTE matching the CTE of the die if the microelectronics device features a large die, whereas, sol-gel processing is used to create a gel with a CTE matching the CTE of the laminate if the microelectronics device features a small die and therefore a large laminate. In the exemplary embodiment, a material with a CTE matching or within a threshold percentage value of the CTE of the die (CTE of die is approximately between 2 and 5), such as silica, is used to create the aerogel or xerogel if a gel with a CTE that matches the CTE of the die is desired. Laminates have a wide range of CTE values, depending on the specific laminate being used in the microelectronics device. Typically, laminates used in microelectronic devices have CTEs that range approximately between 13 and 51. Therefore, depending on the laminate used in the microelectronic device, a polymer matching or within a threshold percentage value of the CTE of the laminate is used to create the aerogel or xerogel if a gel with a CTE that matches the CTE of the laminate is desired. For a laminate, such as gx13, which has a CTE approximately between 40-50, a polymer with a CTE approximately between 40-50, such as polyvinyl chloride, can be used. For a laminate, such as gz, which has a CTE around 13, a polymer and $SiO_2$ composite with a CTE around 13, such as polycarbonate/$SiO_2$, can be used. In the exemplary embodiment, for a gel created with a CTE matching the CTE of the die or the CTE of the laminate, the threshold percentage value is 1%, however, in other embodiments; the threshold percentage value may be another value. Therefore, in the exemplary embodiment, the CTE of the gel is considered to match the CTE of the die or the CTE of the laminate (whichever is desired) as long as the CTE of the gel is within 1% of the CTE of the die or the CTE of the laminate.

A metal plate is then inserted into the gel to create a lid for the microelectronic device (step 204). In the exemplary embodiment, the metal plate is made of copper or aluminum and is inserted into a location in the gel so that when the lid is placed atop the microelectronic device, the metal plate is directly atop the die of the microelectronic device. In other embodiments, the metal plate may be another metal with similar thermal conductivity as copper or aluminum.

In the exemplary embodiment, a polymer is then added to the gel (step 206). Aerogel and xerogel can be brittle materials. Adding a polymer helps reinforce and reduce the brittleness of the gel. In the exemplary embodiment, the specific polymer added to the gel has a CTE below 51 (ppm/° C.). For example, polystyrene, which has a CTE of 50.4 ppm/° C., could be an appropriate polymer to add to the gel. In other embodiments, polymers with various other CTEs may be added, however, if the CTE of the polymer added is too high, the polymer may overly stress the gel.

Figure 2:
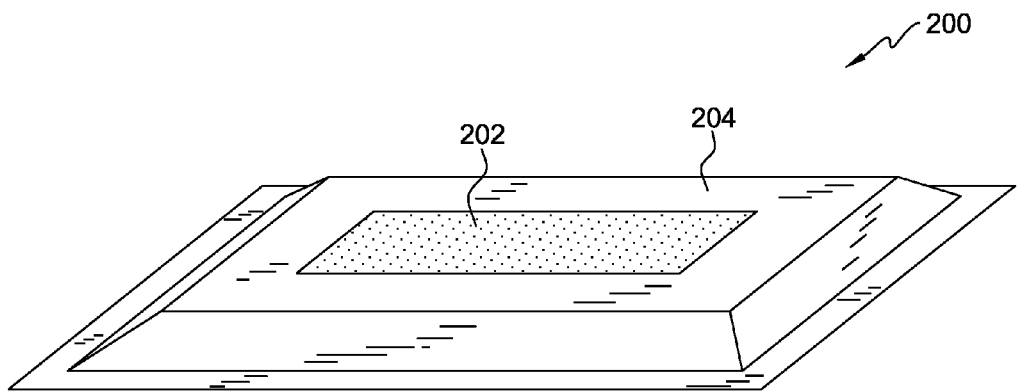
FIG. 2 depicts a microelectronics device including a lid fabricated using sol-gel processing, in accordance with an embodiment of the invention.
Figure 3:
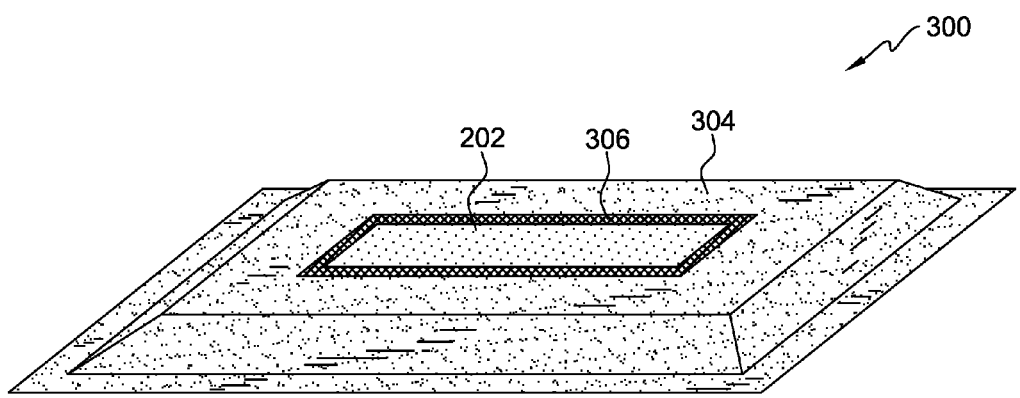
FIG. 3 depicts a microelectronics device including a lid with a polymer interface, fabricated using sol-gel processing, in accordance with an embodiment of the invention.

FIGS. 2 and 3 depict two embodiments of a lid for a microelectronics device, fabricated by way of performing the steps described in FIG. 1. FIG. 2 depicts lid 200, which includes metal plate 202 and gel 204. In the exemplary embodiment, gel 204 is a polymer aerogel or polymer xerogel with a CTE approximately between 40 and 50, while metal plate 202 is either copper or aluminum. In other embodiments, gel 204 may be another gel produced via sol-gel processing with a similar CTE, and metal plate 202 may be another metal with similar thermal conductivity as copper or aluminum.

FIG. 3 depicts lid 300, which includes metal plate 202, gel 304, and polymer interface 306. In the exemplary embodiment, gel 304 is silica aerogel or xerogel and polymer interface 306 is a polymer piece inserted into lid 300 in order to act as an interface between metal plate 202 and gel 204. Silica aerogel or xerogel is especially brittle, with properties very similar to glass. Adding polymer interface 306 removes any direct contact between gel 304 and metal plate 202 which can be advantageous when metal plate 202 expands. A polymer interface could also be included in FIG. 2, however, since the depicted gel, gel 204, is a polymer aerogel or xerogel with a CTE between 40 and 50, a polymer interface may not be required. In other embodiments, instead of adding polymer interface 306, an adhesive may be added between gel 304 and metal plate 202 to act as an interface to minimize any direct contact between gel 304 and metal plate 202.

Typically, microelectronic devices have a copper lid which can add stress on the die and the laminate of the device. Replacing a copper lid with an aerogel or xerogel lid can reduce stress at the lid-die and die-laminate interface, by reducing the difference between the respective coefficients of thermal expansion. In addition, with the increasing cost of copper, fabricating an aerogel or xerogel lid can be an economically practical option as well.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a tunable semiconductor device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A microelectronic device comprising:
   at least one die;
   at least one microelectronic structure located on the at least one die;
   at least one laminate;
   at least one lid, wherein the at least one lid includes at least one metal piece disposed within a gel, the gel having a coefficient of thermal expansion (CTE) within a threshold percentage value of either a CTE of the at least one die or a CTE of the at least one laminate, and a polymer joining the gel to the at least one metal piece;
   wherein the at least one metal piece, the gel, and the polymer are disposed on the same plane within the at least one lid.

2. The microelectronic device of claim 1, wherein the gel includes silica aerogel or silica xerogel or a combination of both.

3. The microelectronic device of claim 1, wherein the metal piece includes copper or aluminum.

4. The microelectronic device of claim 1, wherein the gel includes a polymer in order to reduce brittleness.

5. The microelectronic device of claim 4, wherein, for a gel with a CTE within a threshold percentage value of the CTE of the laminate, the polymer has a CTE between 13 and 51 (ppm/ ° C.).

6. The microelectronic device of claim 4, wherein, for a gel with a CTE within a threshold percentage value of the CTE of the die, the polymer has a CTE between 4 and 12 (ppm/ ° C.).

7. The microelectronic device of claim 1, wherein the at least one metal piece is located in a first location in the at least one lid.

8. The microelectronic device of claim 7, wherein, when the lid is placed on top of the microelectronic device, the first location of the at least one lid covers the at least one die of the microelectronic device.

9. The microelectronic device of claim 1, wherein the threshold percentage value is less than 1%.

10. The microelectronic device of claim 1, wherein the gel includes a xerogel or an aerogel.

11. The microelectronic device of claim 10, wherein the gel includes polyvinyl chloride, and the laminate includes gx13.

12. The microelectronic device of claim 10, wherein the gel includes a polymer and $SiO_2$ composite and the laminate includes gz.

13. A microelectronic device comprising:
    at least one die;
    at least one microelectronic structure located on the at least one die;
    at least one laminate;
    at least one lid, wherein the at least one lid includes at least one metal piece disposed within a gel, the gel having a coefficient of thermal expansion (CTE) within threshold percentage value of either a CTE of the at least one die or a CTE of the at least one laminate, and wherein the threshold percentage is less than 1%, and
    a polymer joining the gel to the at least one metal piece;
    wherein the at least one metal piece, the gel, and the polymer are disposed on the same plane within the at least one lid.

14. The microelectronic device of claim 13, wherein the at least one metal piece is located in a first location in the at least one lid.

15. The microelectronic device of claim 13, wherein the at least one lid is placed on top of the microelectronic device, the first location of the at least one lid covers the at least one die of the microelectronic device.

16. The microelectronic device of claim 13, wherein the gel includes xerogel or an aerogel.

17. The microelectronic device of claim 13, wherein the gel includes_ olyvinyl chloride, and the laminate is gx13.

18. The microelectronic device of claim 17, wherein the gel includes a polymer and $SiO_2$ and the laminate is gz.

* * * * *